United States Patent

Harada et al.

[11] Patent Number: 5,973,406
[45] Date of Patent: Oct. 26, 1999

[54] ELECTRONIC DEVICE BONDING METHOD AND ELECTRONIC CIRCUIT APPARATUS

[75] Inventors: Masahide Harada; Toru Nishikawa; Ryohei Satoh, all of Yokohama; Osamu Yamada, Hiratsuka; Takayuki Uda; Mitsugu Shirai, both of Hadano, all of Japan

[73] Assignee: Hitachi, Ltd., Tokyo, Japan

[21] Appl. No.: 08/918,019

[22] Filed: Aug. 25, 1997

[30] Foreign Application Priority Data

Aug. 26, 1996 [JP] Japan ................................ 8-223859

[51] Int. Cl.$^6$ .................................................. H01L 23/48
[52] U.S. Cl. ......................... 257/780; 257/737; 438/613; 438/612
[58] Field of Search ............................... 438/613, 614, 438/615, 612; 257/780, 737, 738

[56] References Cited

U.S. PATENT DOCUMENTS

| | | |
|---|---|---|
| 3,621,564 | 11/1971 | Tanaka et al. . |
| 4,379,218 | 4/1983 | Grebe et al. . |
| 4,545,610 | 10/1985 | Lakritz et al. . |
| 4,732,312 | 3/1988 | Kennedy et al. . |
| 5,188,280 | 2/1993 | Nakao et al. . |
| 5,246,880 | 9/1993 | Rule et al. . |
| 5,284,287 | 2/1994 | Wilson et al. . |
| 5,616,517 | 4/1997 | Wen et al. . |
| 5,712,192 | 1/1998 | Lewis et al. . |

FOREIGN PATENT DOCUMENTS

| | | |
|---|---|---|
| 56-78356 | 6/1981 | Japan . |
| 59-225893 | 12/1984 | Japan . |
| 64-10634 | 1/1989 | Japan . |
| 2-152246 | 6/1990 | Japan . |
| 2-290693 | 11/1990 | Japan . |
| 4-220168 | 8/1992 | Japan . |
| 6-041601 | 2/1994 | Japan . |
| 6-291457 | 10/1994 | Japan . |
| 8-108292 | 4/1996 | Japan . |
| 8-162753 | 6/1996 | Japan . |
| 8-293665 | 11/1996 | Japan . |
| WO97/32457 | 4/1997 | WIPO . |

OTHER PUBLICATIONS

1st Symposium "Microjoining and Assembly Technology in Electronics", Feb. 9–10, 1995, pp. 187–192.

*Primary Examiner*—Caridad Everhart
*Attorney, Agent, or Firm*—Fay, Sharpe, Beall, Fagan, Minnich & McKee

[57] ABSTRACT

An electronic device is solder bonded properly without using fluxes nor precise positioning with respect to a substrate. A bond pad with a size about twice the size of terminal pad of the electronic device is formed in a region on the substrate where the electronic device is to be mounted. After placing the electronic device of the substrate surface, the whole unit is heated in a nitrogen atmosphere to melt a bump formed on the terminal pad of the electronic device. The molten solder wets and spreads over the bond pads formed on the substrate, thereby establishing reflow soldering between the bond pads and the terminal pads. The position of the electronic device with respect to the substrate is spontaneously corrected due to a self-alignment function induced by wetting and spreading of the molten solder over the bond pad of the substrate.

6 Claims, 5 Drawing Sheets

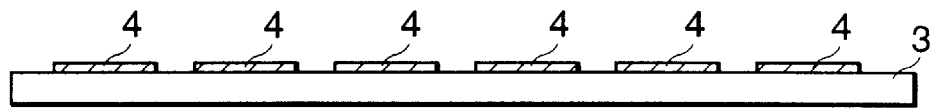
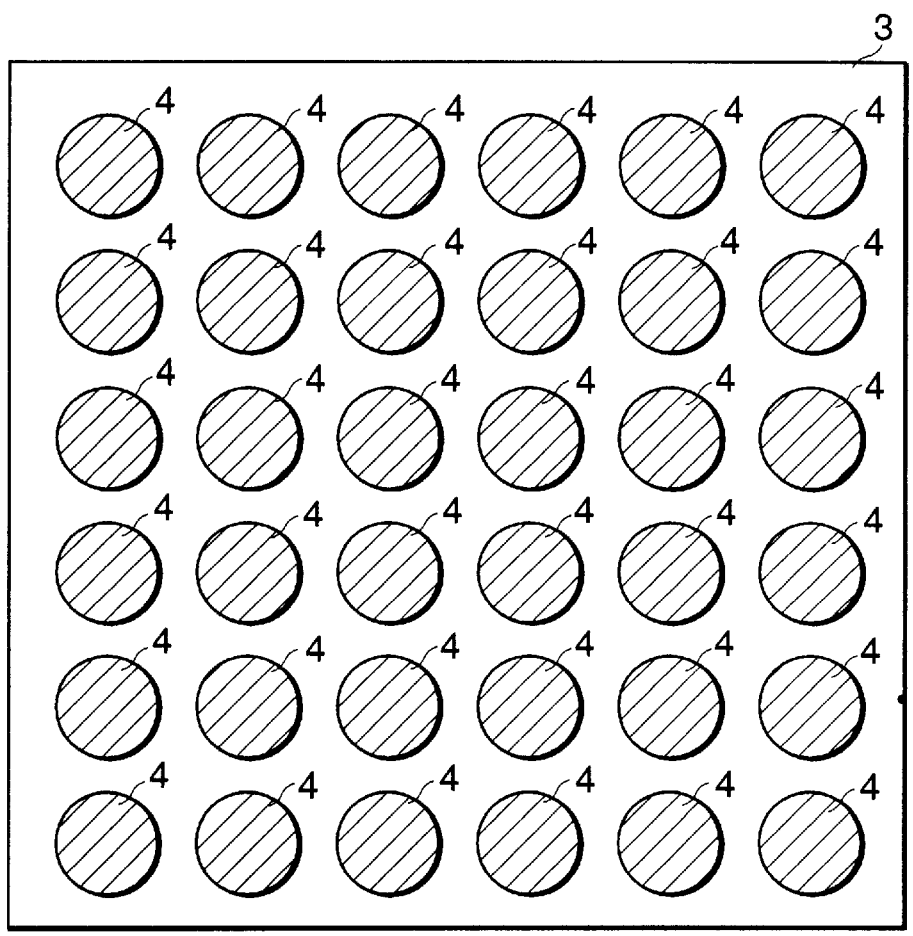
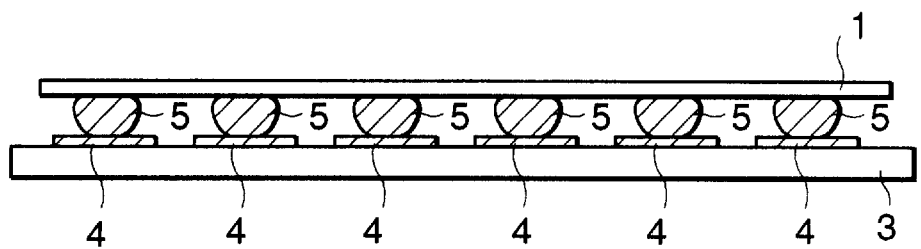

PRIOR ART FIG.8A
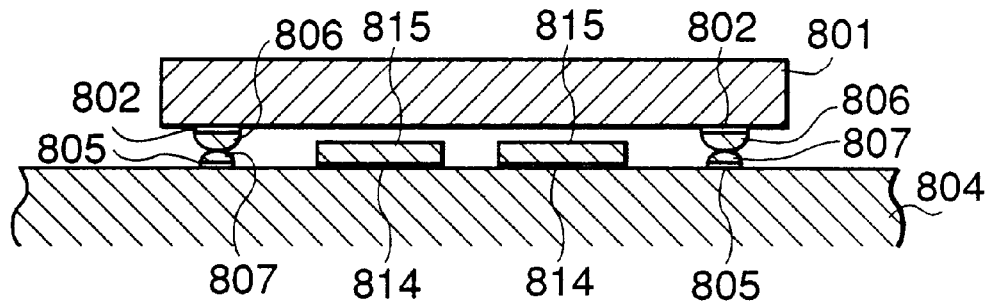
PRIOR ART FIG.8B
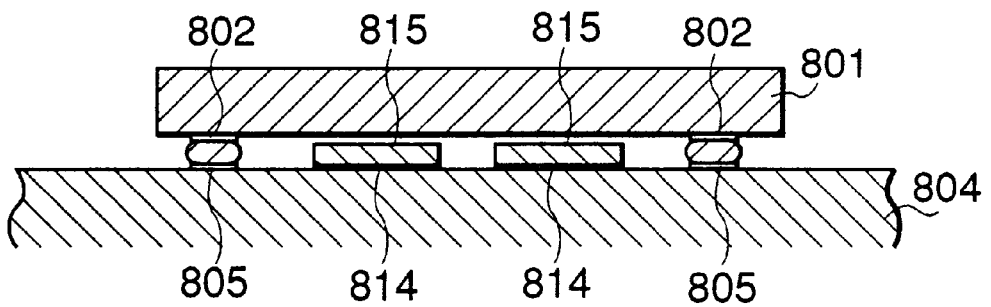
PRIOR ART FIG.8C
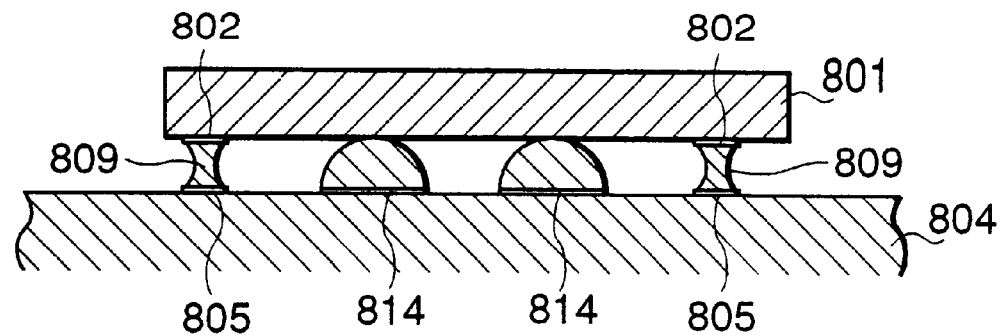

ELECTRONIC DEVICE BONDING METHOD AND ELECTRONIC CIRCUIT APPARATUS

BACKGROUND OF THE INVENTION

1. Field of the Invention

This invention is related to a bonding method of electronic circuit devices.

2. Description of Related Art

When some of electronic devices in an apparatus become unnecessary due to a change in specification or the like and are required to be removed from their substrates, it is typical to conduct re-heating of solder joints bonding between terminal pads of these unnecessary electronic devices and bond pads of a device mounting pattern formed on the substrates.

However, at the same time, the re-heating of solder joints induces the formation of intermetallic compound layers of less wettability on the bond pads of the device mounting pattern on the substrate. This becomes a problem since these intermetallic compound layers prevent terminal pads of newly mounted electronic devices from creating stable bonds.

Japanese Patent Application Publication (KOKAI) No. 64-10634 suggested a semiconductor integrated circuit apparatus in which electronic devices may be removed from a substrate by using mechanical force without damaging the substrate to be recycled.

In the semiconductor integrated circuit apparatus of prior art, terminal pads of the electronic devices are soldered on the corresponding bond pads of the device mounting pattern formed on the substrate using a face down bonding method. Here, each of the bond pads of the device mounting pattern is provided so as to have a larger surface area compared to the corresponding terminal pad of the electronic device so as that the mechanical force (the force to break the solder joint) applied during the removal of the electronic device may be concentrated toward a side of the electronic device.

Accordingly, the substrate to be recycled is hardly damaged while the unnecessary electronic devices may be destroyed. This type of solder bonding has an advantage when frequent replacements of the electronic devices mounted on the substrate are anticipated.

There is another method of bonding between the bond pads of the device mounting pattern formed on the substrate and the terminal pads of the electronic devices. It is known as a flip-chip method in which solder bumps formed on the terminal pads of the electronic devices are melted to form bonding between the terminal pads of the electronic devices and the bond pads of the device mounting pattern formed on the substrate so as to establish electrical connections between them.

The flip-chip method has an advantage in that the electronic device may be soldered with an appropriate attitude at a predetermined location since a position of the electronic device with respect to the substrate is self-aligned due to a surface tension of the molten solder.

In order to fully utilize the self-alignment function in the prior art, it is necessary to remove an oxidized film on the surface of the solder bump formed on the terminal pad of the electronic device before the soldering, by applying fluxes on the solder bump.

Reliability of the electronic circuit apparatus which is the final product largely depends on the stability of bonds between the device mounting pattern and the terminal pads of the electronic device. The published specification of Japanese Utility Model Application No. 54-155903 teaches a semiconductor chip mount body in which optimization in the shape of solder joint, which bonds between the bond pads of the device mounting pattern formed on the substrate and the terminal pad of the electronic device, is attempted so as to provide long term stability of the bond.

As shown in FIG. 8A, insulation pads 814 are formed on a substrate 804 used in the semiconductor chip mount body at positions which do not correspond to any terminal pads 802 of an electronic device 801, in addition to bond pads 805 of a device mounting pattern. To mount the electronic device 801, solder pastes 815 are printed in a sheet-like form on the insulation pads 814. The solder paste 815 has a higher melting point than that of solder bumps 806, 807 formed on the terminal pads 802 of the electronic device 801 and the bond pads 805 of the device mounting pattern.

The flux is applied on each of the solder bumps 806 formed on the terminal pads 802 of the electronic device 801 and the solder bumps 807 formed on the bond pads 805 of the substrate 804 to remove the surface oxidized film.

After the electronic device 801 is disposed on the substrate 804 at a predetermined position, both of them are heated up to a predetermined temperature. The solder bumps 806, 807 formed on the terminal pads 802 and the bond pads 805 melt first. The molten solder wets and spreads over surfaces of the bond pad 805 formed on the substrate 804 and the terminal pad 802 of the electronic device 801, as shown in FIG. 8B.

Then, as shown in FIG. 8C, the solder sheets 815 begin to melt. Here, the molten solder sheets 815 do not wet or spread over the surface of the electronic device 801. The molten solder sheets 815 hold up the electronic device 801 by their surface tensions, thereby causing the solder joints 809 to form a drum type shape or a pillar type shape, both of which are stable against external stresses, between the bond pads 805 formed on the substrate 804 and the terminal pads 802 of the electronic device 801.

SUMMARY OF THE INVENTION

However, an effective utilization of the self-alignment function during formation of solder joints is not included in any of the objectives of Japanese Patent Application Publication (KOKAI) No. 64-10634 which discloses the semiconductor integrated circuit apparatus.

The use of fluxes is required in the semiconductor chip mount body disclosed in the published specification of Japanese Utility Model Application No. 54-155903 to remove the oxidized film formed on the surface of the solder bump 806 formed on the terminal pad 802 of the electronic device 801 and on the solder bump 807 formed on the bond pads 805 of the device mounting pattern of the substrate 804. A residue of the fluxes may sometimes cause corrosion of the solder joint. If this happens, performance of the semiconductor chip mount body which becomes the final product may be impaired.

Further, the prior art of the published specification of Japanese Utility Model Application No. 54-155903 requires additional fabrication process steps since it is necessary to provide different types of solders with different melting points on the bond pad 805 of the device mounting pattern of the substrate 804 and the insulation pad 814.

An object of the present invention is to provide a fluxless solder bonding method by which an electronic device may be soldered properly without precise positioning of the electronic device with respect to a substrate in advance.

Another object of the present invention is to form solder joints which are stable in the long term using the above fluxless solder bonding method without increasing a number of fabrication process steps.

The above objects of the present invention are accomplished by an electronic device bonding method by which bumps formed on terminal pads of an electronic device are melted to form solder joints so as to connect the terminal pads of the electronic device and bond pads of a device mounting pattern formed on the substrate, comprising the steps of: fabricating the device mounting pattern which comprises a plurality of bond pads, each of which has a larger surface area than the corresponding terminal pad of the electronic device, within a region of the substrate surface where the electronic device is to be mounted; and melting the bumps formed on the terminal pads of the electronic device with the bumps formed on the terminal pads of the electronic device contacting with the corresponding bond pads of the device mounting pattern fabricated on the substrate so as to form solder joints bonding between the bond pads of the device mounting pattern fabricated on the substrate and the terminal pads of the electronic device.

According to the present invention, when the bumps formed on the terminal pads of the electronic device are being melted, a position of the electronic device with respect to the substrate is spontaneously corrected by a force induced during wetting and spreading of the molten bumps over the bond pads of the substrate because of the above feature. Therefore it becomes possible to solder bond the electronic device at a proper position on the substrate without precise positioning of the electronic device with respect to the substrate in advance.

According to the present invention, wetting and spreading of the molten solder on the bond pads of the device mounting pattern of the substrate are highly promoted since each of the bond pads occupies a larger surface area than the corresponding terminal pad of the electronic device. Thus, it become possible to maximize the self-alignment function, thereby eliminating the need of flux application on the solder bumps formed on the terminal pads of the electronic device in advance.

In the present invention, when the electronic device with a plurality of terminal pads is used, a bump formed on at least one of the terminal pads may be a push-up bump for pushing up the electronic device. The push-up bump comes into contact with a surface region of the substrate where no bond pad of the device mounting pattern is formed when the electronic device is mounted on the substrate. The push-up bump is melted during the formation of the solder joint, thereby pushing up the electronic device by its surface tension.

Therefore, the solder joint of a drum type shape which is stable against external stresses, i.e. the solder joint of a long term stability may be formed between the bond pad of the device mounting pattern formed on the substrate and the terminal pad of the electronic device without increasing the number of fabrication process steps.

BRIEF DESCRIPTION OF THE DRAWINGS

FIG. 2A is a front view of a substrate according to the first embodiment;

FIG. 2B is a side view of a substrate according to the first embodiment;

FIG. 3 is an explanatory view for an illustration of a fitting step during a solder bonding process in an electronic device bonding method according to the first embodiment;

FIG. 8A is an explanatory view for an illustration of the solder bonding process of the prior art.

FIG. 8B is an explanatory view for an illustration of the solder bonding process of the prior art.

FIG. 8C is an explanatory view for an illustration of the solder bonding process of the prior art.

DESCRIPTION OF THE PREFERRED EMBODIMENTS

The first embodiment of the present invention will now be explained.

First, an electronic device and a substrate used in the embodiment will be explained with reference to FIGS. 1A, 1B, 2A, and 2B.

Figure 1A:
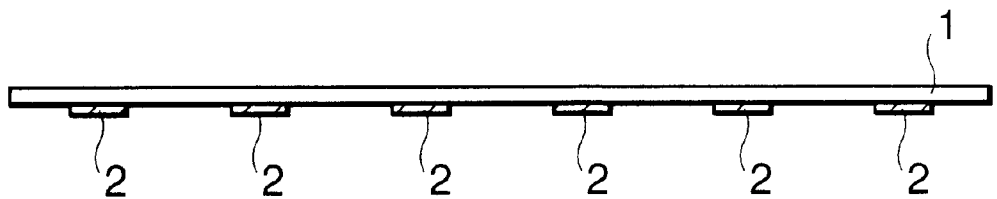
FIG. 1A is a front view of an electronic device according to the first embodiment of the present invention.
Figure 1B:
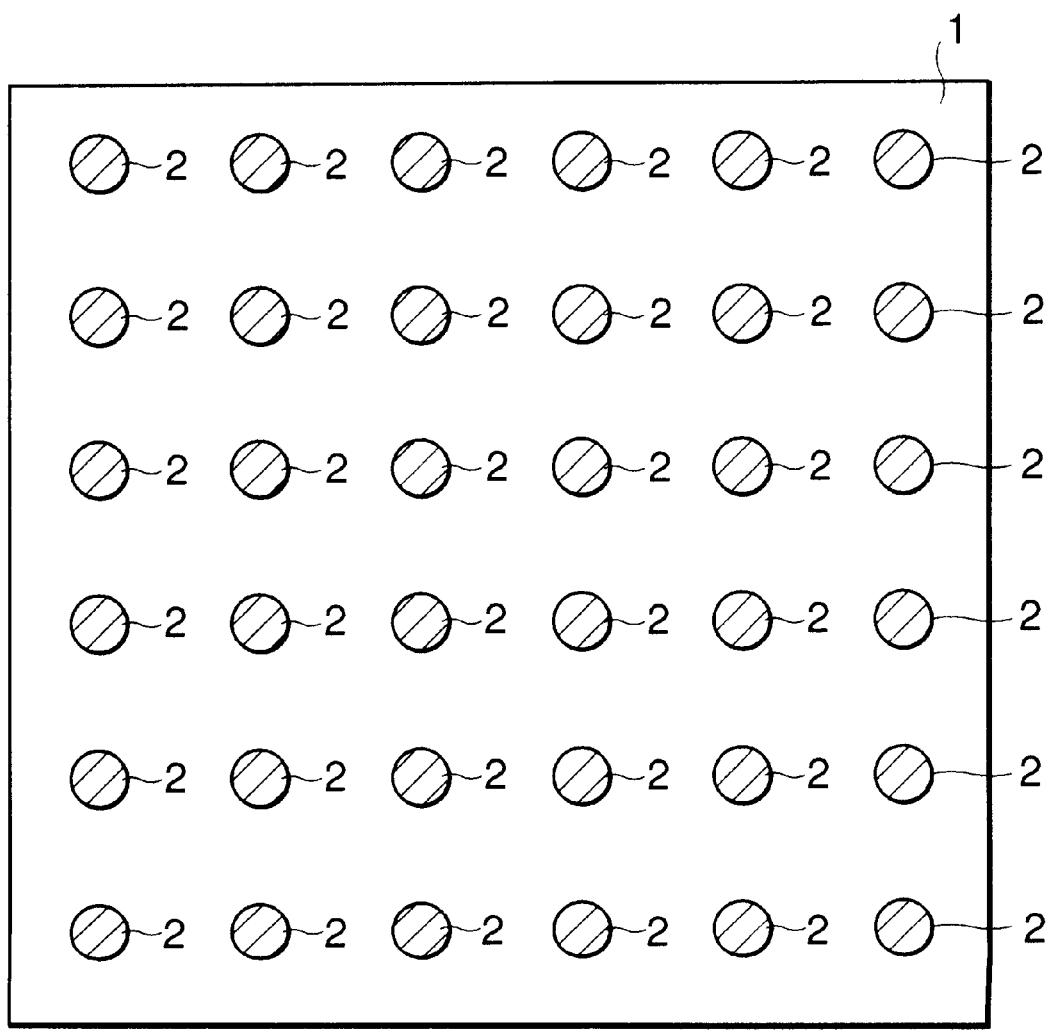
FIG. 1B is a side view of an electronic device according to the first embodiment of the present invention.

A metallic film (metallization) with a two-layer structure is formed using a vapor-deposition method on each of the terminal pads 2 of the electronic device 1 as shown in FIGS. 1A and 1B. The electronic device 1 may be, for example, an LSI chip or the like. The first layer of the metallic film is composed of a metallic substance, such as Ni-Cu alloy or the like, which is highly adhesive to the terminal pad 2 and has a slow rate of reaction with solder. The second layer of the metallic film is composed of a metallic substance, such as Au or the like, which is highly wettable with a bump substance.

Each of the bond pads 4 of the device mounting pattern is formed on the substrate 3 shown in FIGS. 2A and 2B at a position corresponding to the terminal pad 2 of the electronic device 1 with each of the bond pads 4 having a larger surface area than that of the corresponding terminal pad 2 of the electronic device 1. For example, the surface area of the bond pad 4 may be a predetermined number of times larger than that of the terminal pad 2. Further, a metallization similar to that of the terminal pad 2 of the electronic device 1 is formed on each of the bond pads 4.

Figure 4:
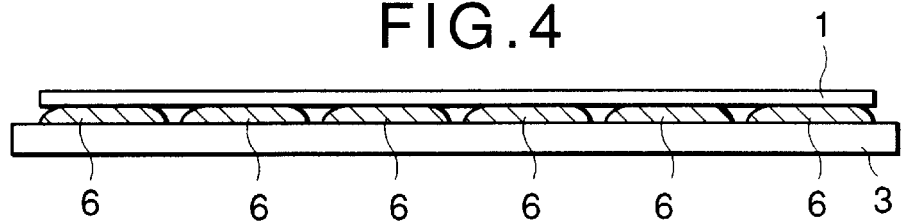
FIG. 4 is an explanatory view for an illustration of the solder bonding process in the electronic device bonding method according to the first embodiment.

The electronic device bonding method, by which the terminal pads 2 of the electronic device 1 are solder bonded on the bond pads 4 of the device mounting pattern formed on the substrate 3, will now be explained with reference to FIGS. 3 and 4.

First, the bump 5 is formed on each of the terminal pads 2 of the electronic device 1 by depositing solder onto the terminal pads 2 using a bump fabrication technique of the prior art, such as the vapor deposition method. Preferably, 63Sn37Pb (composition of 37% Pb, 63% Sn) or 98Pb2Sn (composition of 98% Pb, 2% Sn) or 96.5Sn3.5Ag (composition of 96.5% Sn, 3.5% Ag) may be used as the solder substance.

After placing the electronic device 1 at a predetermined position of the substrate 3, the whole unit is heated in a nitrogen atmosphere to melt the bumps 5 formed on the terminal pads 2 of the electronic device 1 as shown in FIG. 3. The molten solder 6 wets and spreads over the bond pads 4 formed on the substrate 3 as shown in FIG. 4, thereby establishing the reflow soldering between the bond pads 4 formed on the substrate 3 and the terminal pads 2 of the electronic device 1.

A typical heating temperature of not less than the melting point (183° C.) and not more than 215° C., and a typical heating period of about 3 minutes may be employed when 63Sn37Pb is selected as the solder substance. A typical heating temperature of not less than the melting point (320° C.) and not more than 360° C., and a typical heating period of about 3 minutes may be employed when 98b2Sn is selected as the solder substance. A typical heating temperature of not less than the melting point (221° C.) and not more than 245° C., and a typical heating period of about 3 minutes may be employed when 96.5Sn3.5Ag is selected as the solder substance.

As the molten solder wets and spreads over each of the bond pads 4 formed on the substrate 3, the self-alignment function becomes effective, and a minor misalignment that may have occurred during the initial positioning of the electronic device 1 with respect to the substrate 3 may be spontaneously corrected. As a result, the electronic device 1 is properly solder bonded on the substrate 3. Thus, according to the present embodiment, the fluxless bonding, which is explained in the section of DESCRIPTION OF RELATED ART as it has an advantage in replacing electronic devices on the substrate, may be formed without precise positioning of the electronic device with respect to the substrate in advance.

The self-alignment function still becomes effective even without applying the flux in advance on the bumps 5 formed on the terminal pads 2 of the electronic device 1 because each of the bond pads 4 of the device mounting pattern formed on the substrate 3 is provided so as to have a larger surface area than the corresponding terminal pad 2 of the electronic device 1. This feature significantly improves abilities of wetting and spreading of the molten solder over the bond pads 4 formed on the substrate 3.

This has been proved quantitatively by inspecting an electronic circuit apparatus manufactured according to the present embodiment.

The inventors of the present invention prepared several types of substrates, each having 490 bond pads with a size varied for different types of substrate. Ten electronic devices (LSI chips), each having 490 terminal pads (diameter 130 $\mu$m), are solder bonded on each type of substrate. Then, positions of the soldered LSI chips on each of the substrate are inspected.

The inspection revealed that only two of the electronic devices were soldered at the proper positions on the substrate with the bond pad of the same size as the terminal pad of the electronic device. On the other hand, more of the electronic devices were soldered at the proper position on the substrate with the bond pad which had a larger size than the terminal pad of the electronic device. That is, a clear improvement of the self-alignment function due to an enlargement of the bond pad of the device mounting pattern formed on the substrate has been confirmed.

Particularly on the substrates with the bond pads each having a size larger than about twice the size of the terminal pad of the electronic device, all of the electronic devices, or nearly all of them on the substrate, were soldered at the proper positions. At a practical level, however, it is recommended to use the bond pad of the device mounting pattern with a size about twice the size of the corresponding terminal pad of the electronic device when a recent tendency to utilize a finer pitch for the terminal pads of the electronic device is taken into consideration. For example, a bond pad with a diameter of 200 $\mu$m may be employed for a terminal pad with a diameter of 130 $\mu$m.

The second embodiment of the present invention will now be explained.

Figure 5A:
FIG. 5A is a front view of the substrate according to the second embodiment of the present invention.
Figure 5B:
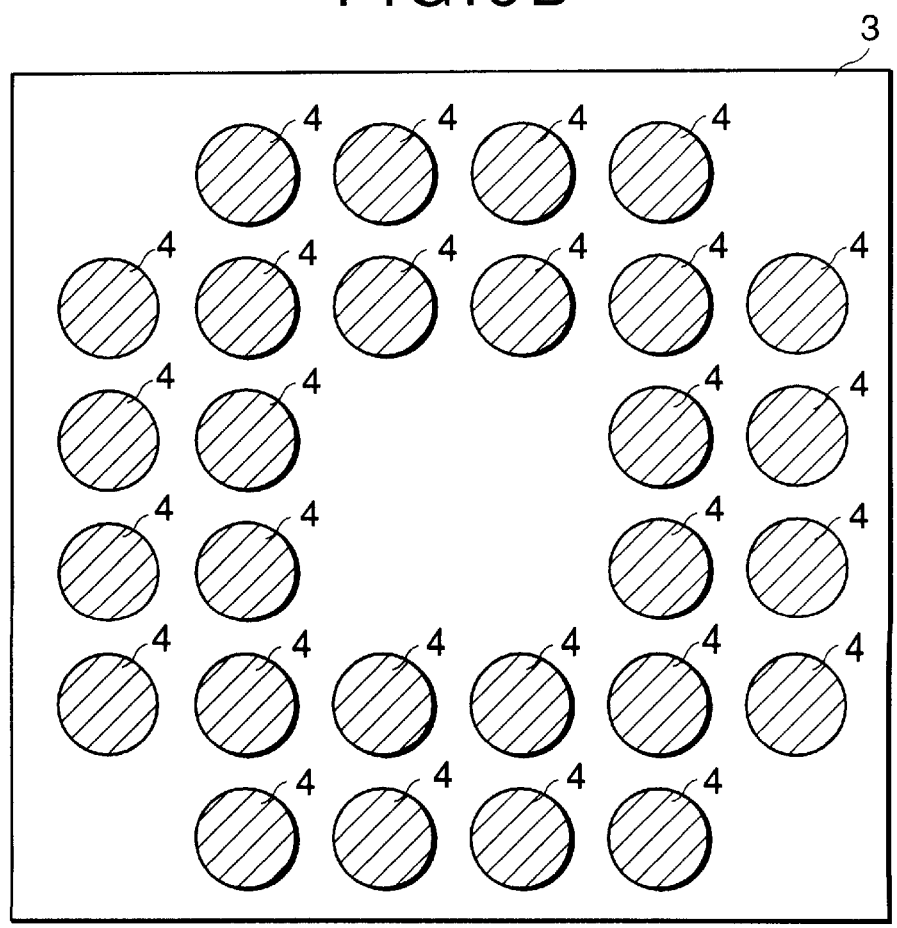
FIG. 5B is a side view of the substrate according to the second embodiment of the present invention.

In the present embodiment, the substrate 3 shown in FIGS. 5A, 5B is used instead of the substrate 3 shown in FIG. 2A, 2B in order to optimize a shape of the solder joint which bonds between the bond pad 4 of the device mounting pattern formed on the substrate 3 and the terminal pad 2 of the electronic device 1. The explanation is as follows.

The bond pads 4 with a larger surface area than the corresponding terminal pads 2 of the electronic device 1 to be mounted (as mentioned above, preferably more than about twice the size) are formed on the substrate 3 of FIGS. 5A, 5B in a similar way to that of the substrate 3 of FIGS. 2A, 2B. Further, a metallization similar to that of the previous embodiment is formed on each of the bond pads 4 of the device mounting pattern which is formed on the substrate 3.

An array of the bond pads 4 of the device mounting pattern formed within a predetermined region of the substrate 3 shown in FIGS. 5A, SB is fabricated so that it has the same array structure as that of the terminal pads 2 of the electronic device 1 to be mounted in the region, except for parts of which that have been omitted. More concretely, the substrate 3 is provided so as to have vacant areas, in which a predetermined number of bond pads (typically, a total of 20 bond pads) could have been formed, near the center and periphery of the region where the electronic device 1 is to be mounted.

Figure 6:
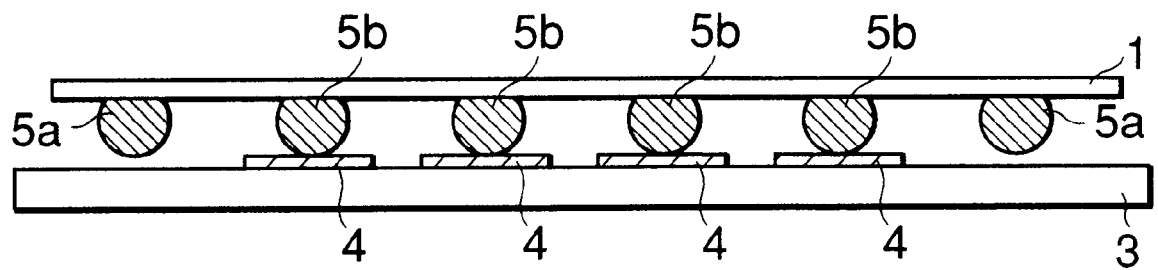
FIG. 6 is an explanatory view for an illustration of an fitting step during an solder bonding process in an electronic device bonding method according to the second embodiment.

As shown in FIG. 6, when the electronic devices 1 are placed on the substrate 3, bumps 5b formed on a part of the terminal pads of the electronic device 1 contact with the corresponding bond pads 4 formed on the substrate 3 while bumps 5a formed on the rest of the terminal pads contact with surface areas of the substrate 3 where no bond pad 4 is formed.

Figure 7:
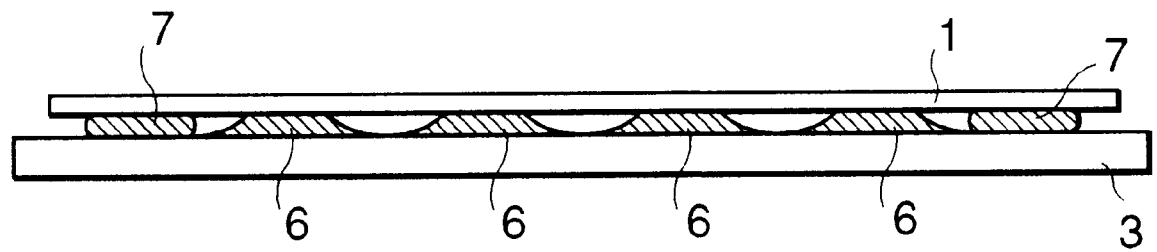
FIG. 7 is an explanatory view for an illustration of the solder bonding process in the electronic device bonding method according to the second embodiment.

As shown in FIG. 7, when the whole unit is heated, the bumps 5b formed on the part of the terminal pads start to melt, and rapidly wet and spread over the bond pads 4 formed on the substrate 3 even though no flux was applied, while molten bumps 5a on the rest of the terminal pads do not wet nor spread over the surface of the substrate 3 and are gradually condensed into ball shaped bodies 7. This causes a gradual separation of the electronic device 1 from the substrate 3 due to the surface tension induced by the ball shaped bodies 7. As a result, the solder joints 6 with a drum type shape or a pillar type shape, which are stable against external stresses, are formed in between the part of the terminal pad of the electronic device 1 and the bond pads 4 of the device mounting pattern of the substrate 3.

This has been quantitatively verified by inspecting an electronic circuit apparatus manufactured according to the present embodiment.

The inventors of the present invention performed a temperature cycling test (−50° C.~125° C.) on two types of electronic circuit apparatuses, one of which is manufactured using the substrate 3 having the bond pads (250 $\mu$m in diameter) arrayed as shown in FIG. 2A, 2B and the electronic device having the terminal pads (150 μm in diameter) arrayed as shown in FIG. 1A, 1B, and the other using the substrate 3 having the bond pads (250 μm in diameter) arrayed as shown in FIGS. 5A, 5B and the electronic device having the terminal pads (150 μm in diameter) arrayed as shown in FIG. 1A, 1B.

The result showed that a variation (increase) in a resistance of the solder joint started to be observed as early as the 1000th cycle of the temperature cycling test for the electronic circuit apparatus manufactured using the substrate 3 shown in FIG. 2A, 2B and the electronic device 1 shown in FIG. 1A, 1B. In contrast, almost no variation in the resistance of the solder joint was observed even after 1000th cycle of the temperature cycling test for the electronic circuit apparatus manufactured using the substrate 3 shown in FIGS. 5A, 5B and the electronic device 1 shown in FIG. 1A, 1B. This clearly indicates an improvement in reliability of the solder joint.

Here, the same self-alignment function as that of the first embodiment is also effective in the present invention.

Accordingly, the present embodiment enables the formation of a solder joint with a long term stability, simply by modifying the substrate 3 to be used and without changing the number of the fabrication process steps. For example, the fabrication process of the present embodiment becomes much simpler than that of the semiconductor chip mount body disclosed in the published specification of Japanese Utility Model Application No. 54-155903 described in DESCRIPTION OF RELATED ART, since no bump using two types of solders is required in the present embodiment.

According to the present invention, the electronic device may be solder bonded properly without using the flux nor precise positioning of the electronic device with respect to the substrate in advance. Further according to the present invention, by modifying the array structure of the bond pads of the device mounting pattern of the substrate to be used, the solder joint with a long term stability may be formed without increasing a number of the fabrication process steps.

What is claimed is:

1. An electronic device bonding method by which bumps formed on terminal pads of an electronic device are melted to form solder joints so as to connect said bond pads of device mounting pattern formed on a substrate and said terminal pads of said electronic device, comprising the steps of:

fabricating said device mounting pattern which comprises a plurality of said bond pads, each having a surface area about twice a size of a corresponding one of said terminal pads of said electronic device, within a surface region of said substrate where said electronic device is to be mounted; and melting said bumps formed on said terminal pads of said electronic device while said bumps contact with the corresponding bond pads of said device mounting pattern fabricated on said substrate so as to form solder joints connecting between said bond pads of said device mounting pattern fabricated on said substrate and said terminal pads of said electronic device.

2. An electronic device bonding method by which bumps formed on a plurality of terminal pads of an electronic device are melted to form solder joints so as to connect bond pads of a device mounting pattern formed on a substrate and said terminal pads of said electronic device, comprising the steps of:

fabricating said device mounting pattern which comprises a plurality of said bond pads, each having a larger surface area than a corresponding terminal pad of said electronic device, within a surface region of said substrate where said electronic device is to be mounted;

melting said bumps formed on said terminal pads of said electronic device while said bumps contact with corresponding bond pads of said device mounting pattern fabricated on said substrate so as to form solder joints connecting between said bond pads of said device mounting pattern fabricated on said substrate and said terminal pads of said electronic device; and, wherein at least one of said bumps formed on at least one of the plurality of said terminal pads of said electronic device is an electronic device push-up bump, which contacts with a surface region of said substrate where no bond pad is formed when said electronic device is mounted on said substrate, and the melted push-up bump pushes said electronic device up by its surface tension during the formation of said solder joints.

3. The electronic device bonding method in accordance with claim 2, wherein, said surface region of said substrate, where no bond pad is formed and to which said electronic device push-up bump contacts, includes areas in the center and the periphery of the region where said electronic device is to be mounted.

4. The electronic device bonding method in accordance with claim 2, wherein, said solder joints, which bond between said bond pads formed on said substrate and a part of said terminal pads on which said push-up bump has not been formed, form a drum type shape.

5. An electronic circuit apparatus in which solder joints are formed between bonds pads of a device mounting pattern formed on a substrate and terminal pads of an electronic device using a flip-chip method, wherein:

said bond pad of said device mounting pattern formed on said substrate has a surface area about twice a size of a corresponding terminal pad of said electronic device.

6. An electronic circuit apparatus in which solder joints are formed between bonds pads of a device mounting pattern formed on a substrate and a plurality of terminal pads of an electronic device using a flip-chip method, wherein:

said bond pad of said device mounting pattern formed on said substrate has a larger surface area than a corresponding terminal pad of said electronic device;

at least one of said bumps formed on the plurality of said terminal pads said electronic device is an electronic device push-up bump, which contacts with a surface region of said substrate where no bond pad is formed when said electronic device is mounted on said substrate, and the melted push-up bump pushes said electronic device up by its surface tension during the formation of said solder joints; and, said solder joints, which bond between said bond pads formed on said substrate and said terminal pads on which said push-up bump has not been formed, form a drum type shape.

* * * * *